(12) United States Patent
Saito et al.

(10) Patent No.: US 7,909,931 B2
(45) Date of Patent: Mar. 22, 2011

(54) SILICA GLASS CRUCIBLE

(75) Inventors: Ryouhei Saito, Yamagata (JP);
Toshiyuki Kikuchi, Niigata (JP);
Kiyoaki Misu, Yamagata (JP); Kazuko Fukutani, Yamagata (JP); Kazuyoshi Kato, Nanyou (JP)

(73) Assignee: Covalent Materials Corporation, Tokyo (JP)

( * ) Notice: Subject to any disclaimer, the term of this patent is extended or adjusted under 35 U.S.C. 154(b) by 1012 days.

(21) Appl. No.: 11/729,862

(22) Filed: Mar. 30, 2007

(65) Prior Publication Data
US 2007/0256628 A1  Nov. 8, 2007

(30) Foreign Application Priority Data

Mar. 30, 2006  (JP) .................. 2006-094453
Jan. 26, 2007  (JP) .................. 2007-016170

(51) Int. Cl.
*C30B 27/00* (2006.01)
(52) U.S. Cl. .......... 117/200; 117/208; 117/213; 117/13; 117/900
(58) Field of Classification Search .................. 117/200, 117/208, 213, 13, 900
See application file for complete search history.

(56) References Cited

U.S. PATENT DOCUMENTS

| 6,548,131 B1 | 4/2003 | Fabian et al. |
| 2002/0192409 A1 | 12/2002 | Ohama et al. |
| 2006/0236916 A1 * | 10/2006 | Ohama ......................... 117/13 |

FOREIGN PATENT DOCUMENTS

| DE | 199 17 288 A1 | 10/2000 |
| EP | 1632592 A1 * | 3/2006 |
| JP | 02-059486 A | 2/1990 |
| JP | 06092779 A * | 4/1994 |
| JP | 2005-206446 A | 8/2005 |
| JP | 2005-272178 A | 10/2005 |

OTHER PUBLICATIONS

Patent Abstracts of Japan. English Abstract and Computer translation of JP 06-092779 (1994).*

* cited by examiner

*Primary Examiner* — Matthew J Song
(74) *Attorney, Agent, or Firm* — Foley & Lardner LLP

(57) ABSTRACT

The present invention provides a silica glass crucible for manufacturing a silicon single crystal, in which melt vibration can be controlled more certainly and a high yield of single crystal can be realized. A first substantially bubble-free layer 10a having a thickness of 100 μm-450 μm is formed on the inner periphery side of an initial melt line zone 10 which has a height of 10 mm-30 mm, of a transparent layer, a bubble-containing layer 10b having a thickness of 100 μm or more and bubbles with an average diameter of 20 μm-60 μm is formed outside the above-mentioned first substantially bubble-free layer 10a, and a second substantially bubble-free layer 10c having a thickness of 300 μm or more is formed on the inner periphery side in the whole region lower than the above-mentioned initial melt line zone 10.

7 Claims, 3 Drawing Sheets

SILICA GLASS CRUCIBLE

BACKGROUND OF THE INVENTION

1. Field of the Invention

The present invention relates to a silica glass crucible used for pulling a silicon single crystal.

2. Description of the Related Art

The Czochralski method (the CZ method) is widely used for growing a silicon single crystal. In this method, a polycrystalline silicon material is filled into a crucible, heated and melted so that silicon melt is accommodated, then a seed crystal is brought into contact with a surface of the above-mentioned silicon melt. As the crucible is rotated, this seed crystal is rotated in an opposite direction and pulled upwards at the same time, to form a single crystal in the lower end of the seed crystal.

As the crucible for manufacturing this silicon single crystal, a silica glass crucible is used conventionally. This silica glass crucible has a container-shape and a two-layer structure, in which the outer layer of the container is formed with an opaque layer and the inner layer is formed with a transparent layer. The outer opaque layer includes a large number of bubbles and is formed of natural silica glass whose purity is low compared with synthetic silica glass, but which is excellent in heat resistance. The inner transparent layer is formed of a natural silica material or a synthetic silica material. Since the synthetic silica glass has an advantage that there are few impurities and a yield of dislocation-free single crystal (hereinafter referred as DF yield) is good, a so-called synthetic silica glass crucible is popular in recent years.

However, in the case where a single crystal is pulled up using the silica glass crucible as mentioned above, there is a technical problem that rotation of the silicon melt and the seed crystal or immersion of the seed crystal causes the surface of the silicon melt to vibrate (hereinafter referred to as melt vibration). In other words, there is a problem that when this melt vibration occurred, it becomes difficult to seed the seed crystal so that the pull-up cannot be started easily, and that the crystal is more likely to be dislocated when being pulled, and the DF yield decreases.

In order to solve such a problem, patent document 1 discloses a silica glass crucible (not shown) which is provided with a large number of recesses in the inner periphery of the crucible (initial melt line zone or upper region including this zone) with which the surface level of the silicon melt (melt line) is in contact at the time of starting the pull-up of the single crystal. According to the crucible as disclosed in patent document 1, protruding parts are formed at the end of the above-mentioned large number of recesses so that local surface tension of the surface of the silicon melt is increased to control the melt vibration of the silicon melt.

[Patent document 1] Japanese Patent Publication (KOKAI) No. 2005-272178

However, as for the crucible in which recesses are conventionally formed in the inner periphery of the crucible, since there are a large number of fine recesses exposed at the inner surface of the crucible, a cleaning fluid, such as hydrofluoric acid, does not sufficiently enter into the inside of the recesses in the final etching process so that the impurities or particles which are produced at the time of forming the recesses are not removed sufficiently. As a result, there is a problem that as the inner surface of the crucible is eroded by the silicon melt at the time of pulling the single crystal, the impurities and particle are released into the silicon melt, dislocation occurs in the silicon single crystal, leading to a need for meltback which is a process of melting the crystal into the silicon melt, and to reduction in the DF yield.

Further, the silica glass crucible is arranged and controlled to be perpendicular within a carbon crucible in a pull-up apparatus. However, it is not always to be arranged to be exactly perpendicular. When it is arranged to be inclined, a recess-forming zone which is formed at the inner periphery of the crucible and has a height of 0.5 mm-10 mm is not fully matched to a position (melt line) of the surface of the silicon melt over the whole circumference at the time of starting the pull-up, and it cannot be said that the melt vibration control effect is certainly sufficient.

SUMMARY OF THE INVENTION

The present invention has been made under the situations as described above, and aims to provide a silica glass crucible in which a polycrystalline silicon material is filled, heated and melted so that silicon melt is accommodated, then a silicon single crystal is pulled up from the above-mentioned silicon melt, wherein melt vibration is more certainly controlled to realize a high rate of single crystallization.

In order to solve the above mentioned problem, the silica glass crucible in accordance with the present invention is a silica glass crucible having a layer structure where an opaque layer is formed at the outer periphery and a transparent layer is formed at the inner periphery, in which a polycrystalline silicon material is filled up on the above-mentioned inner periphery side, heated and melted so that silicon melt is accommodated, and a single crystal is pulled up by the Czochralski method, characterized in that a first substantially bubble-free layer having a thickness of 100 µm-450 µm is formed on the inner periphery side of an initial melt line zone, which has a height of 10 mm-30 mm, of the above-mentioned transparent layer, a bubble-containing layer having a thickness of 100 µm or more and bubbles with an average diameter of 20 µm-60 µm is formed outside the above-mentioned first substantially bubble-free layer, and a second substantially bubble-free layer having a thickness of 300 µm or more is formed on the inner periphery side in the whole region lower than the above-mentioned initial melt line zone.

According to such a structure, a recess is not formed at the inner periphery of the crucible before heating and melting the polycrystalline silicon material. For this reason, unlike the conventional one, there is no possibility that the impurities or particles remaining in the exposed recesses may be released into the silicon melt at the time of pulling the single crystal. Therefore, it is possible to reduce a probability of occurrence of meltback and improve the DF yield.

Further, filled up in the crucible, the polycrystalline silicon material is heated and melted to provide the silicon melt which is accommodated, then the surface of the silicon melt comes into contact with the initial melt line zone, the first substantially bubble-free layer is eroded by the silicon melt before the single crystal pulling is started, and the bubbles which the bubble-containing layer has are opened. Thus, the surface of the initial melt line zone is irregularly shaped. The surface of the silicon melt comes into contact with the irregularly shaped portion at the time of starting the single crystal pull-up, so that the melt vibration is controlled. Therefore, it is easy to seed the seed crystal and it is possible to improve the DF yield because of no dislocations in the crystal during the pull-up.

Further, since the above-mentioned initial melt line zone is caused to have a height of at least 10 mm or more, it is possible to prevent displacement between the surface of the silicon melt and the irregular surface, the displacement being caused by an inclined angle at the time of installing the crucible, material input, etc. In other words, at the time of starting the pull-up of the single crystal, the surface of the silicon melt is always located in the initial melt line zone, so that control effects of the melt vibration can be obtained by way of contact with the irregular surface. Furthermore, since the height of the initial melt line zone is 30 mm or less, the probability of occurrence of the meltback is reduced, high workability is obtained, and the DF yield can be improved.

Still further, by forming the above-mentioned first substantially bubble-free layer to have a thickness of 100 μm-450 μm, the first substantially bubble-free layer is eroded until the start of the pull-up of the single crystal, the bubbles of the bubble-containing layer are opened, and the irregular shape can be formed on the surface of the initial melt line zone.

Furthermore, since the above-mentioned bubble-containing layer has a thickness of 100 μm or more, even if the erosion by the silicon melt proceeds during the process of pulling up the single crystal, the surface of the silicon melt can always be brought into contact with the irregular shape, so that the melt vibration can be controlled.

Further, forming the second substantially bubble-free layer having a thickness of 300 μm or more avoids a problem that the silicon melt reaches the transparent layer having a predetermined number of bubbles due to the erosion of the silicon melt, so that a large number of bubbles are opened. Therefore, it is possible to prevent ingress of foreign matter into the silicon melt due to roughness of the surface of the crucible which may be caused by the open bubbles.

Further, it is preferable that a density of the bubbles which the above-mentioned bubble-containing layer has is $5/mm^3$ to $70/mm^3$ (pieces per $mm^3$). The bubble number density is thus set as $5/mm^3$ or more, so that a more sufficiently irregular shape can be obtained to control the melt vibration. Further, by setting the density as $70/mm^3$ or less, the ingress of foreign matter into the silicon melt due to the surface roughness can be more certainly prevented.

According to the present invention, in the silica glass crucible where the silicon melt is accommodated and the silicon single crystal is pulled up from the above-mentioned silicon melt, and it is possible to obtain the silica glass crucible which controls the melt vibration more certainly and realizes a high rate of single crystallization.

DESCRIPTION OF THE PREFERRED EMBODIMENTS

Figure 1:
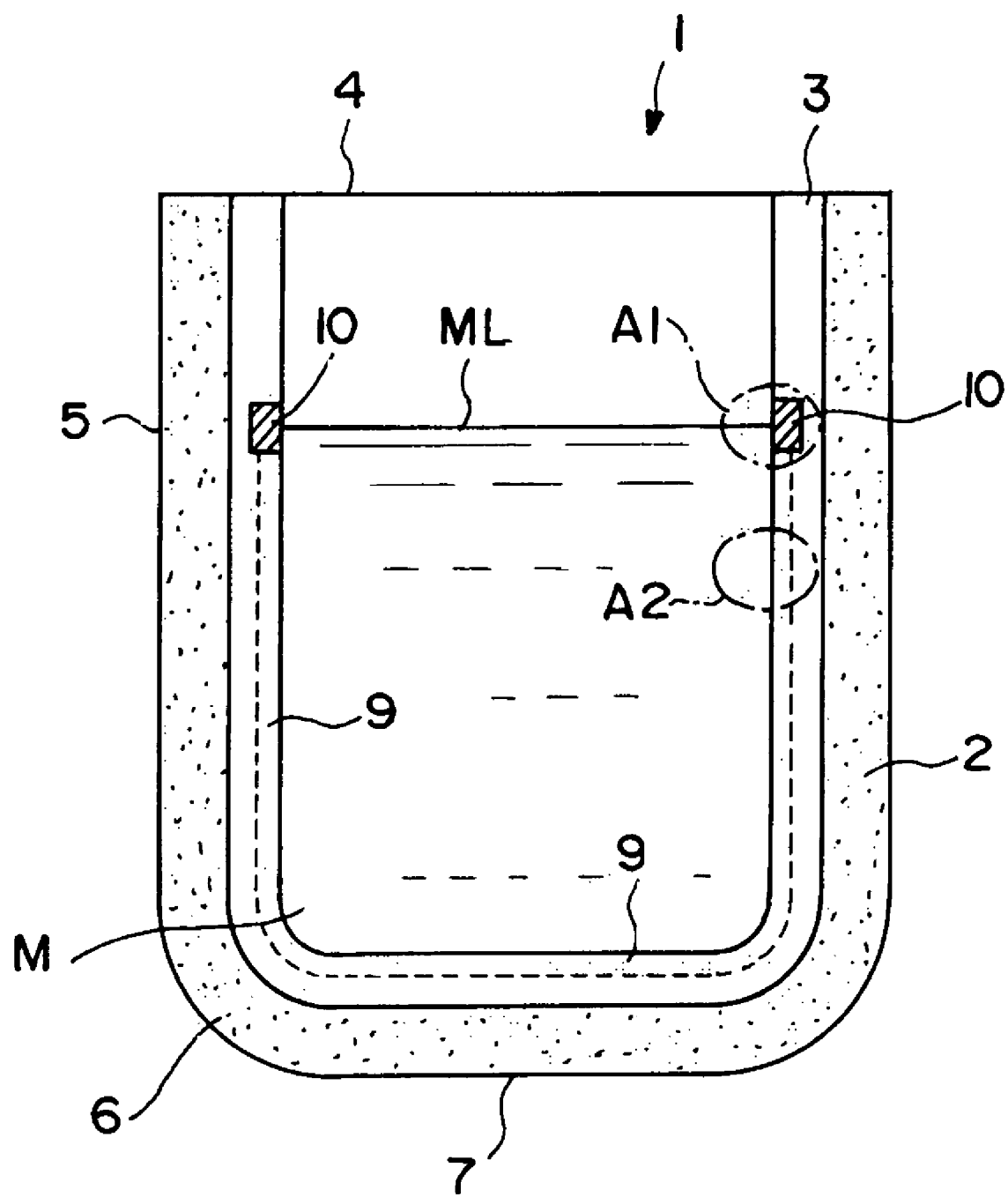
FIG. 1 is a sectional view schematically showing a structure of a silica glass crucible in accordance with the present invention.

Hereafter, a preferred embodiment of a silica glass crucible in accordance with the present invention will be described with reference to the drawings. FIG. 1 is a sectional view schematically showing a structure of a silica glass crucible.

As shown, a silica glass crucible 1 (only referred to as crucible 1 hereafter) has a container-shape and a two-layer structure in which an opaque layer 2 containing a large number of bubbles (preferably $50/mm^3$ or more) is formed at the outer periphery side, and a transparent layer 3 containing a small number of bubbles (preferably $9/mm^3$ or less) and having a thickness of 2 mm (for example) is formed at the inner periphery side. In addition, the opaque layer 2 is made of natural silica glass (obtained by melting a natural material, such as crystal quartz), and the transparent layer 3 is formed of synthetic silica glass.

Further, as shown, the crucible 1 is formed into a U-shape (in cross-section) having a straight part 5, a circle part 6, and a bottom 7 in order from an upper opening 4, so that silicon melt M obtained by melting polycrystalline silicon material is accommodated on the inner periphery side.

Further, an initial melt line zone 10 having a height of 10 mm-30 mm is formed on the inner periphery side of the transparent layer 3 and above a position which is half a height of the crucible, so that a surface ML (hereinafter referred to as melt line ML) of the silicon melt M at the time of starting the pull-up of the single crystal is brought into contact with the initial melt line zone 10.

Figure 2:
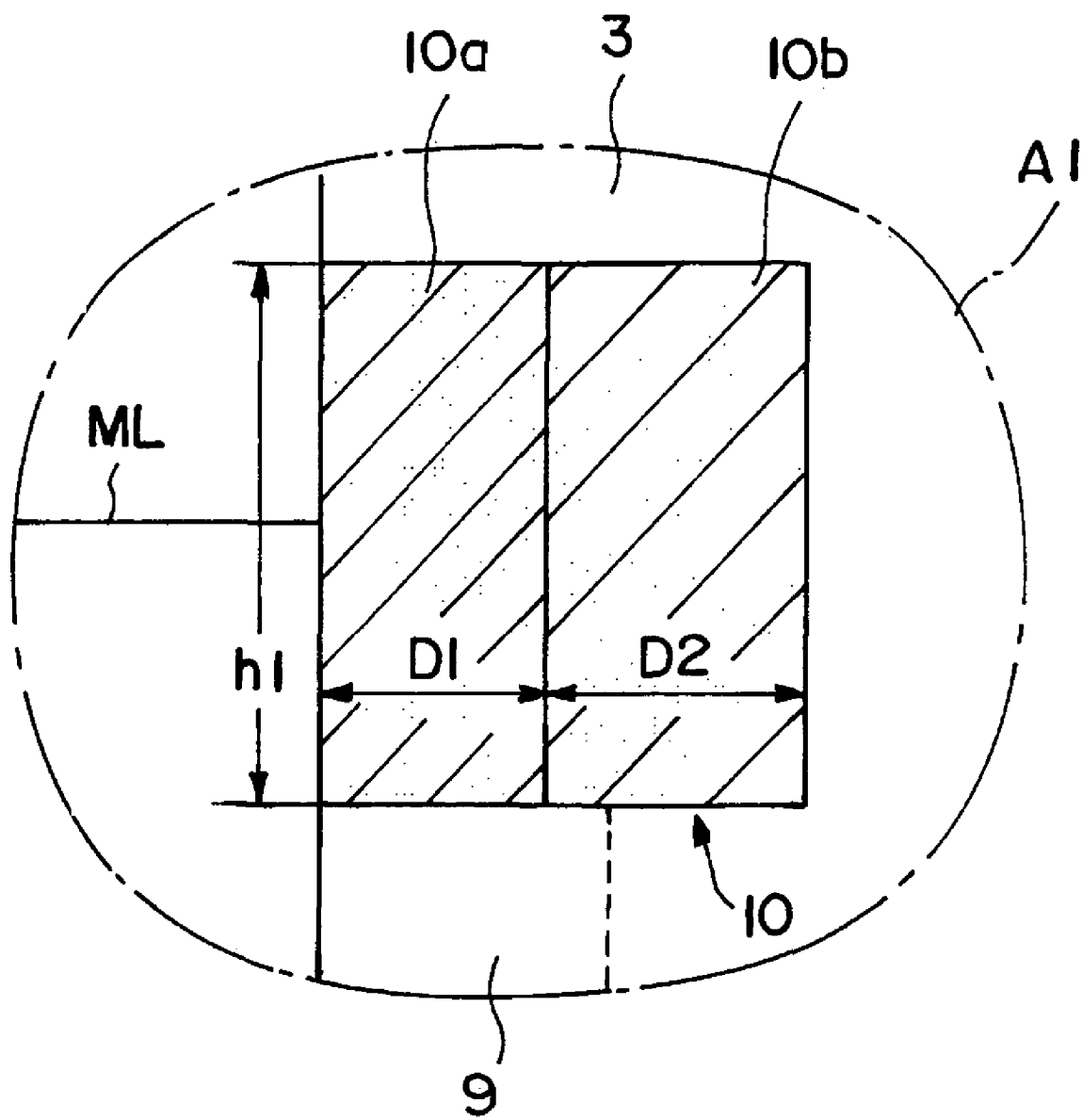
FIG. 2 is an enlarged sectional view of an area A1 of FIG. 1.

The transparent layer 3 at this initial melt line zone 10 is further made to be a multilayer structure. In other words, as an enlarged view of an area A1 including the zone 10 is shown in FIG. 2, a substantially bubble-free layer 10a (first substantially bubble-free layer) having a thickness of D1 and a bubble number density of $2/mm^3$ or less is formed in the zone 10 on the inner periphery side. Furthermore, on the outside a bubble-containing layer 10b is formed which has a thickness D2 and a bubble number density of $5/mm^3$ or more.

According to such a structure, a recess is not formed at the inner periphery of the crucible 1 before accommodating the silicon melt M. In other words, it is not necessary to form a recess at the inner periphery in a process of manufacturing the crucible 1. Therefore, unlike the conventional one, there is no possibility that the impurities or particles which are generated when forming the recesses and remain in the recesses may be released into the silicon melt M at the time of pulling the single crystal.

Further, according to this structure, in the polycrystalline silicon material melting stage, the substantially bubble-free layer 10a is eroded by the silicon melt M. Further, the silicon melt M comes into contact with the bubble-containing layer 10b and the bubbles which the bubble-containing layer 10b has are opened. When the bubbles of this bubble-containing layer 10b are opened, the surface of the bubble-containing layer 10b which is in contact with the silicon melt M becomes the irregular shape, whereby the melt vibration at the time of pulling the single crystal is controlled.

Furthermore, a height h1 of the initial melt line zone 10 as shown in FIG. 2 is set as 10-30 mm, as described above. Thus, since it has a height of at least 10 mm, it is possible to prevent displacement between the surface of the melt line ML and the irregular surface, the displacement being caused by the inclined angle at the time of installing the crucible, the material input, etc. In other words, at the time of starting the pull-up of the single crystal, the melt line ML is always located in the initial melt line zone 10, so that control effects of the melt vibration can be obtained by way of contact with the irregular surface. Furthermore, since the height hi is 30 mm or less, the probability of occurrence of the meltback is reduced, high workability is obtained, and the DF yield can be improved.

Further, the substantially bubble-free layer 10a as shown in FIG. 2 is formed to have the thickness D1 of 100 μm-450 μm. This is because there is a problem that if the thickness D1 is less than 100 μm, the bubbles of the bubble-containing layer 10b are opened in an early stage of melting the polycrystalline silicon material, due to the erosion by the silicon melt M, so that a large number of bubbles are caused to open from the early stage of the above-mentioned erosion. In other words, as a large number of bubbles are opened particles are generated so that dislocation arises at the time of forming a crown part of a silicon single crystal ingot. As a result, there is a problem that the probability of occurrence of the meltback increases, and the DF yield decreases due to surface roughness caused by meltback repetition.

Further, another reason is that when the thickness D1 exceeds 450 μm, the erosion by the silicon melt M takes a long time until the bubbles of the bubble-containing layer 10b are opened, and there is a possibility that irregularities may not be formed at the time of starting the pull-up.

Further, it is preferable that the bubble number density of the substantially bubble-free layer 10a is 2/mm$^3$ or less. If there are bubbles with the bubble number density of the substantially bubble-free layer 10a exceeding 2/mm$^3$, the surface is roughened because the bubbles are opened due to the erosion of the silicon melt M. As a result, there is a possibility that a foreign particle may contaminate the silicon melt M, and the DF yield may be reduced, that is not preferred.

Further, the bubble-containing layer 10b as shown in FIG. 2 is formed to have a thickness D2 of 100 μm or more. More preferably, it is 300 μm or more. In other words, the erosion of the bubble-containing layer 10b by the silicon melt M proceeds throughout a single crystal pulling process. However, even if the meltback is repeated and an amount of erosion becomes large, it is possible to obtain the melt vibration control effect in the pulling process by providing the thickness D2 in this way and forming the irregular shape.

Further, an average diameter of the bubbles which the bubble-containing layer 10b contains is 20 μm-60 μm. This is because the irregular shape required for controlling the melt vibration cannot be formed, if a bubble diameter is less than 20 μm. Another reason is that if the diameter exceeds 60 μm, there is a possibility that a large piece of quartz may contaminate the silicon melt in the case of opening the bubbles, and the dislocation of the crystal may take place.

Further, a bubble number density of the bubbles contained in this bubble-containing layer 10b is 5/mm$^3$-70/mm$^3$. The reason is that the larger the bubble density is, the more effectively the melt vibration is controlled, while if it exceeds 70/mm$^3$ then there is a possibility that the surface is roughened and a foreign particle may contaminate the silicon melt, leading the reduction in the DF yield. Further, another reason is that the bubble number density of less than 5/mm$^3$ does not provide the irregular shape which is sufficient to control the melt vibration.

Further, as shown in FIG. 1, formed in the crucible 1, under the initial melt line zone 10, on the inner periphery side throughout an inner region of the transparent layer 3 is a substantially bubble-free layer 9 (second substantially bubble-free layer) having a predetermined thickness and a bubble number density of 2/mm$^3$ or less.

Figure 3:
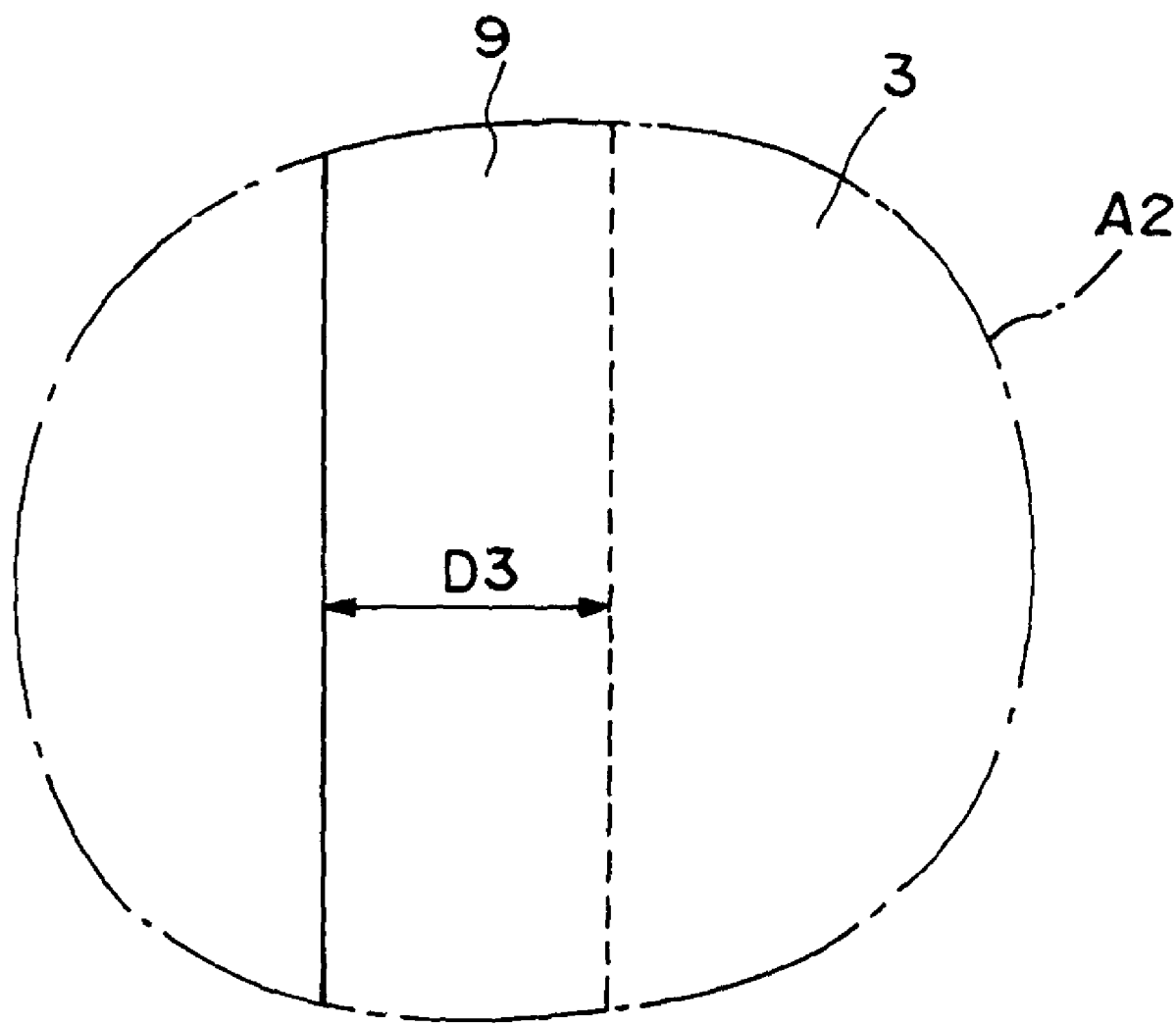
FIG. 3 is an enlarged sectional view of an area A2 of FIG. 1.

An area A2 as shown in FIG. 1 is an area including this substantially bubble-free layer 9, and FIG. 3 shows an enlarged view of this area A2. As shown in FIG. 3, this substantially bubble-free layer 9 is formed to have a thickness D3 of at least 300 μm, preferably 500 μm or more, from the inner surface of the transparent layer 3.

If the thickness D3 of the substantially bubble-free layer 9 is less than 300 μm, the silicon melt M reaches the transparent layer 3 having the bubble number density of 9/mm$^3$ or less in the pulling process, due to the erosion of the silicon melt M, so that a large number of bubbles are opened and the inner surface of the crucible is roughened. If the inner surface of this crucible is roughened, a foreign particle may contaminate the silicon melt and the DF yield may be reduced, that is not preferred. In view of the amount of erosion of the silicon melt M during the pulling process, it is preferable that it is 500 μm or more.

When pulling the silicon single crystal by using the thus constructed crucible 1, the polycrystalline silicon material inputted into the crucible is melted first to be the silicon melt M.

Here, the melt line ML comes into contact with the initial melt line zone 10, the substantially bubble-free layer 10a is eroded by the silicon melt M until the single crystal pull-up is started, further the bubbles which the bubble-containing layer 10b has are opened. Thus, the surface of the initial melt line zone 10 becomes the irregular shape, and when the melt line ML comes into contact with this irregular shape at the time of starting the single crystal pull-up, the melt vibration is controlled.

As described above, according to the preferred embodiment in accordance with the present invention, the initial melt line zone 10 with which the melt line ML of the silicon melt is in contact at the time of starting the single crystal pull-up is provided at the inner periphery side of the crucible. This initial melt line zone 10 is formed with the substantially bubble-free layer 10a and the outer bubble-containing layer 10b. And the melt vibration can be further controlled at the time of starting the single crystal pull-up by setting the thicknesses, the bubble number densities, the bubble diameters, etc., of the substantially bubble-free layer 10a and the bubble-containing layer 10b as predetermined values, respectively.

Further, since it is not necessary to form a fine irregular shape at the inner periphery of the crucible in the crucible manufacturing process, it is possible to solve the conventional problem that the impurities or particles which are generated when forming the recesses in the crucible manufacturing process and remain in the recesses may be released into the silicon melt M at the time of pulling the single crystal.

Therefore, it is easy to seed the seed crystal, the crystal is not dislocated when being pulled, a rate of occurrence of the meltback is decreased, and it is possible to improve the DF yield. In addition, by the initial melt line in the present invention is meant a circular line with which the silicon melt upper surface before seeding a silicon seed crystal is in contact, as in the Czochralski method where the polycrystalline silicon material is filled into the silica glass crucible, and melted to obtain the silicon melt, to the upper surface of which the above-mentioned silicon seed crystal is seeded, and the silicon single crystal is pulled up.

EXAMPLE

Now, the silica glass crucible in accordance with the present invention will be further described with reference to Example. In this Example, its effects were verified by manufacturing a silica glass crucible as shown in the above-mentioned preferred embodiment, and carrying out experiments by using the crucible.

In addition, a manufacturing process of crucibles used in this Example (Experiments 1-6) was carried out such that, at first, formed bodies having two layers, natural materials in the outer layer and synthetic silica materials in the inner layer, were formed into crucible shape containing minute bubbles at the whole inner surface by controlling a degree of decompression, melting time, etc.

Subsequently, except for an initial melt line zone having a predetermined height (for example, 10 mm-30 mm) and being left above a position which is half the height of the crucibles, the inner surface was ground by machine to remove the minute bubbles at the surface.

Then, the substantially bubble-free layer with a predetermined thickness (for example, 150 μm) was formed by way of arc discharge, while supplying the synthetic silica materials to the whole inner surface, to manufacture a 24-inch silica glass crucible (with an outer diameter of 610 mm and a height of 350 mm) in which a thickness of a transparent layer of the whole crucible was approximately 4 mm and a thickness of an opaque layer was approximately 8 mm. Subsequently, it was subjected to showering and cleaning by means of a 49% solution of hydrofluoric acid for 5 minutes, and a drying process after pure water cleaning.

Further, the density of the bubbles formed in the crucible and the diameters were measured such that a picture was taken from the inner surface of the crucible by using a CCD camera and a halogen lamp, and the thus taken picture was binarized. A measurement field was 500 μm$^2$ or more (preferably 1.0 mm×1.4 mm), and a recognizable diameter of the minimum bubbles was 4.6 μm or more. Further, the measurement was carried out in the thickness direction from the surface to a thickness of 1.0 mm by moving the CCD camera at a pitch of 20 μm.

In addition, this measurement was performed four points (90-degree interval) at substantially regular intervals around a crucible circumference.

[Experiment 1]

In this Experiment, by using the crucibles manufactured by the above-mentioned manufacturing process, 150 kg of polycrystalline silicon material was charged to produce a B-doped (boron-doped) P-type silicon single crystal ingot for manufacturing an 8-inch wafer, during which time measurement was carried out to check whether there was the melt vibration, a number of times of MB (meltback: re-melting the crystal), and the DF yield.

Experimental conditions are shown in Table 1. In Experiment 1, as shown in Table 1, experiments were carried out in the case where the heights h1 of the initial melt line zones 10 as shown in FIG. 1 were 5 mm, 10 mm, 20 mm, 30 mm, and 40 mm respectively (condition 1-condition 5), and the results were verified.

TABLE 1

| | | Initial melt line zone | | | | Lower than initial melt line zone |
|---|---|---|---|---|---|---|
| | | Substantially bubble-free layer | | Bubble containing layer | | Substantially bubble-free layer Thickness (μm) |
| Experiment 1 | Height h1 (mm) | Thickness (μm) | Bubble density (pieces/mm3) | Thickness (μm) | Bubble diameter (μm) | |
| Condition 1 | 5 | 150 | 1 or less | 1000 | 35 | 600 |
| Condition 2 | 10 | 150 | 1 or less | 1000 | 35 | 600 |
| Condition 3 | 20 | 150 | 1 or less | 1000 | 35 | 600 |
| Condition 4 | 30 | 150 | 1 or less | 1000 | 35 | 600 |
| Condition 5 | 40 | 150 | 1 or less | 1000 | 35 | 600 |

The result of this Experiment 1 is shown in Table 2. As shown in Table 2, when the height h1 of the initial melt line zone 10 was 10 mm-30 mm (conditions 3 and 4), there was neither the melt vibration nor MB and the DF yield was 100%. Therefore, it was confirmed that the height hi is preferably 10 mm-30 mm.

TABLE 2

| Experiment 1 | Evaluation Result |
|---|---|
| Condition 1 | Pull-up stops due to occurrence of melt vibration |
| Condition 2 | No melt vibration, DF: 100%, Number of times of MB: 0 |
| Condition 3 | No melt vibration, DF: 100%, Number of times of MB: 0 |
| Condition 4 | No melt vibration, DF: 100%, Number of times of MB: 0 |
| Condition 5 | No melt vibration, DF: 100%, Number of times of MB: 2 |

[Experiment 2]

As with Experiment 1, in this Experiment, a B-doped P-type silicon single crystal ingot for manufacturing an 8-inch wafer was manufactured, during which time detection of the melt vibration, and measurement of a number of times of MB (meltback: re-melting the crystal), and the DF yield were carried out. Experimental conditions are shown in Table 3. In Experiment 2, as shown in Table 2, experiments were carried out in the case where the thicknesses of the substantially bubble-free layer 10a of the initial melt line zones 10 as shown in FIG. 2 were 70 μm, 100 μm, 150 μm, 200 μm, 350 μm, 450 μm, and 530 μm respectively (conditions 6-12), and the results were verified.

TABLE 3

| Experiment 2 | Initial melt line zone | | | | | Lower than initial melt line zone |
|---|---|---|---|---|---|---|
| | Substantially bubble-free layer | | | Bubble containing layer | | Substantially bubble-free layer |
| | Height h1 (mm) | Thickness (μm) | Bubble density (pieces/mm3) | Thickness (μm) | Bubble diameter (μm) | Thickness (μm) |
| Condition 6 | 20 | 70 | 1 or less | 1000 | 35 | 600 |
| Condition 7 | 20 | 100 | 1 or less | 1000 | 35 | 600 |
| Condition 8 | 20 | 150 | 1 or less | 1000 | 35 | 600 |
| Condition 9 | 20 | 200 | 1 or less | 1000 | 35 | 600 |
| Condition 10 | 20 | 350 | 1 or less | 1000 | 35 | 600 |
| Condition 11 | 20 | 450 | 1 or less | 1000 | 35 | 600 |
| Condition 12 | 20 | 530 | 1 or less | 1000 | 35 | 600 |

The result of this experiment 2 is shown in Table 4. As shown in Table 4, when the thickness of the substantially bubble-free layer of the initial melt line zone was 100 μm-450 μm (conditions 7, 8, 9, 10, and 11), there was no melt vibration, there was no MB (or once), and the DF yield was 100%. Therefore, it was confirmed that the thickness of the substantially bubble-free layer in the initial melt line zone is preferably 100 μm-450 μm. In particular, when the thickness of the substantially bubble-free layer in the initial melt line zone is 100 μm-200 μm, there is neither the melt vibration nor MB and the DF yield is 100%, that is more preferred.

TABLE 4

| Experiment 2 | Evaluation Result |
|---|---|
| Condition 6 | No melt vibration, DF: 90%, Number of times of MB: 1 |
| Condition 7 | No melt vibration, DF: 100%, Number of times of MB: 0 |
| Condition 8 | No melt vibration, DF: 100%, Number of times of MB: 0 |
| Condition 9 | No melt vibration, DF: 100%, Number of times of MB: 0 |
| Condition 10 | No melt vibration, DF: 100%, Number of times of MB: 1 |
| Condition 11 | No melt vibration, DF: 100%, Number of times of MB: 1 |
| Condition 12 | Melt vibration occurs at early stage of pulling, then stops, DF: 90%, Number of times of MB: 3 |

[Experiment 3]

As with Experiment 1, in this Experiment, a B-doped P-type silicon single crystal ingot for manufacturing an 8-inch wafer was manufactured, during which time detection of the melt vibration, and measurement of a number of times of MB (meltback: re-melting the crystal), and the DF yield were carried out. Experimental conditions are shown in Table 5. In Experiment 3, as shown in Table 5, experiments were carried out in the case where the bubble number density of the substantially bubble-free layer 10a of the initial melt line zone 10 as shown in FIG. 2 was set as 5/mm$^3$ (somewhat larger), and the result was verified.

TABLE 5

| Experiment 3 | Initial melt line zone | | | | | Lower than initial melt line zone |
|---|---|---|---|---|---|---|
| | Substantially bubble-free layer | | | Bubble containing layer | | Substantially bubble-free layer |
| | Height h1 (mm) | Thickness (μm) | Bubble density (pieces/mm3) | Thickness (μm) | Bubble diameter (μm) | Thickness (μm) |
| Condition 13 | 20 | 150 | 5 | 1000 | 35 | 600 |

The result of this Experiment 3 is shown in Table 6. As shown in Table 6, when the bubble number density of the substantially bubble-free layer of the initial melt line zone was 5/mm³, it was confirmed that there was no melt vibration, but MB took place and the DF yield was decreased.

TABLE 6

| Experiment 3 | Evaluation Result |
| --- | --- |
| Condition 13 | No melt vibration, DF: 95%, Number of times of MB: 1 |

[Experiment 4]

As with Experiment 1, in this Experiment, a B-doped P-type silicon single crystal ingot for manufacturing an 8-inch wafer was manufactured, during which time detection of the melt vibration, and measurement of a number of times of MB (meltback: re-melting the crystal), and the DF yield were carried out. Experimental conditions are shown in Table 7. In Experiment 4, as shown in Table 7, experiments were carried out in the case where the thicknesses of the bubble-containing layer 10b of the initial melt line zones 10 as shown in FIG. 2 were 50 μm, 100 μm, 500 μm, and 1000 μm respectively (conditions 14-17), and the result was verified.

confirmed that the thickness of the bubble-containing layer in the initial melt line zone is preferably 100 μm or more.

TABLE 8

| Experiment 4 | Evaluation Result |
| --- | --- |
| Condition 14 | Pull-up stops due to occurrence of melt vibration |
| Condition 15 | No melt vibration, DF: 100%, Number of times of MB: 0 |
| Condition 16 | No melt vibration, DF: 100%, Number of times of MB: 0 |
| Condition 17 | No melt vibration, DF: 100%, Number of times of MB: 0 |

[Experiment 5]

As with Experiment 1, in this Experiment, a B-doped P-type silicon single crystal ingot for manufacturing an 8-inch wafer was manufactured, during which time detection of the melt vibration, and measurement of a number of times of MB (meltback: re-melting the crystal), and the DF yield were carried out. Experimental conditions are shown in Table 9. In Experiment 5, as shown in Table 9, experiments were

TABLE 7

| Experiment 4 | Initial melt line zone | | | | | Lower than initial melt line zone |
| --- | --- | --- | --- | --- | --- | --- |
| | | Substantially bubble-free layer | | Bubble containing layer | | Substantially bubble-free layer |
| | Height h1 (mm) | Thickness (μm) | Bubble density (pieces/mm3) | Thickness (μm) | Bubble diameter (μm) | Thickness (μm) |
| Condition 14 | 20 | 150 | 1 or less | 50 | 35 | 600 |
| Condition 15 | 20 | 150 | 1 or less | 100 | 35 | 600 |
| Condition 16 | 20 | 150 | 1 or less | 500 | 35 | 600 |
| Condition 17 | 20 | 150 | 1 or less | 1000 | 35 | 600 |

The result of this Experiment 4 is shown in Table 8. As shown in Table 8, when the thickness of the bubble-containing layer of the initial melt line zone was 100 μm-1000 μm (conditions 15, 16, and 17), there was neither the melt vibration nor MB and the DF yield was 100%. Therefore, it was carried out in the case where diameters of bubbles which the bubble-containing layer 10b of the initial melt line zones 10 as shown in FIG. 2 had were 10 μm, 20 μm, 35 μm, 60 μm, and 70 μm respectively (conditions 18-22), and the result was verified.

TABLE 9

| Experiment 5 | Initial melt line zone | | | | | Lower than initial melt line zone |
|---|---|---|---|---|---|---|
| | Substantially bubble-free layer | | | Bubble containing layer | | Substantially bubble-free layer |
| | Height h1 (mm) | Thickness (μm) | Bubble density (pieces/mm3) | Thickness (μm) | Bubble diameter (μm) | Thickness (μm) |
| Condition 18 | 20 | 150 | 1 or less | 1000 | 10 | 600 |
| Condition 19 | 20 | 150 | 1 or less | 1000 | 20 | 600 |
| Condition 20 | 20 | 150 | 1 or less | 1000 | 35 | 600 |
| Condition 21 | 20 | 150 | 1 or less | 1000 | 60 | 600 |
| Condition 22 | 20 | 150 | 1 or less | 1000 | 70 | 600 |

The result of this Experiment 5 is shown in Table 10. As shown in Table 10, when the diameter of the bubbles which the bubble-containing layer of the initial melt line zone had was 20 μm-60 μm (conditions 19, 20, and 21), there was neither the melt vibration nor MB, and the DF yield was 100%. Therefore, it was confirmed that the diameter of the bubbles which the bubble-containing layer of the initial melt line zone has is preferably 20 μm-60 μm.

TABLE 10

| Experiment 5 | Evaluation Result |
|---|---|
| Condition 18 | Pull-up stops due to occurrence of melt vibration |
| Condition 19 | No melt vibration, DF: 100%, Number of times of MB: 0 |
| Condition 20 | No melt vibration, DF: 100%, Number of times of MB: 0 |
| Condition 21 | No melt vibration, |

TABLE 10-continued

| Experiment 5 | Evaluation Result |
|---|---|
| | DF: 100%, Number of times of MB: 0 |
| Condition 22 | No melt vibration, DF: 80%, Number of times of MB: 3 |

[Experiment 6]

As with Experiment 1, in this Experiment, a B-doped P-type silicon single crystal ingot for manufacturing an 8-inch wafer was manufactured, during which time detection of the melt vibration, and measurement of a number of times of MB (meltback: re-melting the crystal), and the DF yield were carried out. Experimental conditions are shown in Table 11. In Experiment 6, as shown in Table 11, experiments were carried out in the case where thicknesses of the substantially bubble-free layer 9 as shown in FIG. 1 were 200 μm, 300 μm, and 500 μm respectively (conditions 23-25), and the result was verified.

TABLE 11

| Experiment 6 | Initial melt line zone | | | | | Lower than initial melt line zone |
|---|---|---|---|---|---|---|
| | Substantially bubble-free layer | | | Bubble containing layer | | Substantially bubble-free layer |
| | Height h1 (mm) | Thickness (μm) | Bubble density (pieces/mm3) | Thickness (μm) | Bubble diameter (μm) | Thickness (μm) |
| Condition 23 | 20 | 150 | 1 or less | 1000 | 35 | 200 |
| Condition 24 | 20 | 150 | 1 or less | 1000 | 35 | 300 |
| Condition 25 | 20 | 150 | 1 or less | 1000 | 35 | 500 |

The result of this Experiment 6 is shown in Table 12. As is clear from Table 12 and the conditions 3, 8, 16, 20 etc., in the above-mentioned experiments 1-5, when the thickness of the substantially bubble-free layer 9 was 300 μm or more (conditions 24 and 25), there was neither the melt vibration nor MB, and the DF yield was 100%. Further, in view of the amount of erosion of the silicon melt during the pulling process, it is preferable that it is 500 μm or more.

TABLE 12

| Experiment 6 | Evaluation Result |
| --- | --- |
| Condition 23 | No melt vibration, DF: 95%, Number of times of MB: 0 |
| Condition 24 | No melt vibration, DF: 100%, Number of times of MB: 0 |
| Condition 25 | No melt vibration, DF: 100%, Number of times of MB: 0 |

In addition, every density of the bubble-containing layers of the silica glass crucibles manufactured in the above experiments 1-6 was within a range of $5/mm^3$-$70/mm^3$.

Comparative Example 1

A manufacturing process of crucibles used in this experiment was carried out such that, at first, formed bodies having two layers, natural materials in the outer layer and synthetic silica materials in the inner layer, were formed into crucible shape where a thickness of a transparent layer containing minute bubbles at the whole inner surface by controlling a degree of decompression, melting time, etc., was approximately 4 mm and a thickness of an opaque layer was approximately 8 mm.

And in the initial melt line zone with a height of 10 mm on the inner surface of the crucible, recesses with a diameter of 100 μm and a depth of approximately 100 μm are arranged alternately or zigzag at a mutual interval of 6 mm by using $CO_2$ laser.

Using this silica glass crucible (obtained by way of the conventional technology), as with the above-mentioned Experiments 1-6, 150 kg of polycrystalline silicon material was charged to produce a B-doped P-type silicon single crystal ingot for manufacturing an 8-inch wafer, during which time measurement was carried out to check whether there was the melt vibration, a number of times of MB (meltback: re-melting the crystal), and the DF yield.

As a result of this experiment, although there was no melt vibration, it was observed that MB was three times and the DF yield was 70%.

From the experimental results of the above Example, according to the silica glass crucible of the present invention, it is confirmed that the melt vibration was controlled and the high rate of single crystallization was realizable.

The present invention relates to the silica glass crucible used for pulling the silicon single crystal, and is suitably used in the semiconductor manufacture industry etc.

This application claims priority from Japanese Patent Application 2006-094453, filed Mar. 30, 2006 and Japanese Patent Application 2007-016170, filed Jan. 26, 2007, which are incorporated herein by reference in their entirety.

What is claimed is:

1. A silica glass crucible having a container shape, comprising:
a transparent layer located at an inner periphery of the crucible,
an opaque layer having a large number of bubbles located at an outer periphery of the crucible, wherein the crucible is configured such that a polycrystalline silicon material is filled up in an internal space of the container, heated, and melted so that a silicon melt is accommodated, and a silicon single crystal is manufactured by the Czochralski method,
a first substantially bubble-free layer having a thickness of 100 μm-450 μm located at an inner periphery side of an initial melt line zone, which has a height of 10 mm-30 mm,
a bubble-containing layer having a thickness of 100 μm or more and including bubbles with an average diameter of 20 μm-60 μm, wherein the bubble-containing layer is located outside said first substantially bubble-free layer, and said transparent layer and said opaque layer are further located outside said bubble-containing layer, and
a second substantially bubble-free layer having a thickness of 300 μm or more located on the inner periphery side in a region lower than said initial melt line zone, wherein said transparent layer and said opaque layer are further formed outside said second substantially bubble-free layer.

2. The silica glass crucible as claimed in claim 1, wherein a density of the bubbles contained in said bubble-containing layer is $5/mm^3$-$70/mm^3$.

3. The silica glass crucible as claimed in claim 1, wherein crucible is arranged such that the first substantially bubble-free layer is located at an inner surface of the crucible and the bubble-containing layer is located a greater distance from a center of the crucible than the first substantially bubble-free layer in a direction from the center of the crucible to the outer periphery of the crucible,
wherein the opaque layer is located a greater distance from the center of the crucible than the bubble-containing layer in the direction from the center of the crucible to the outer periphery of the crucible.

4. The silica glass crucible as claimed in claim 3, wherein the transparent layer extends between the bubble-containing layer and the opaque layer.

5. The silica glass crucible as claimed in claim 1, wherein the first substantially bubble-free layer is located at the inner periphery side of the initial melt line zone such that when the silicon melt is provided the silicon melt will contact the first substantially bubble-free layer.

6. The silica glass crucible as claimed in claim 1, wherein the crucible has a continuous inner surface such that the crucible does not include a recess before the silicon melt is formed.

7. The silica glass crucible as claimed in claim 6, wherein the first substantially bubble-free layer comprises a material that is eroded by the silicon melt, wherein the first substantially bubble-free layer is configured such that a recess is formed in the inner surface of the crucible when the first substantially bubble-free layer is eroded by the silicon melt.

* * * * *